(12) United States Patent
Watanabe

(10) Patent No.: US 6,661,255 B2
(45) Date of Patent: Dec. 9, 2003

(54) INTERFACE CIRCUIT

(75) Inventor: Hiroshi Watanabe, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/179,042

(22) Filed: Jun. 25, 2002

(65) Prior Publication Data

US 2003/0020513 A1 Jan. 30, 2003

(30) Foreign Application Priority Data

Jun. 26, 2001 (JP) ........................................ 2001-193624

(51) Int. Cl.[7] ................................................. H03K 5/08
(52) U.S. Cl. ............................. 326/82; 326/21; 326/22; 327/319; 710/8; 710/29
(58) Field of Search ............................. 326/21, 22, 86, 326/90, 82; 327/319, 321, 387; 710/29, 8, 316

(56) References Cited

U.S. PATENT DOCUMENTS 5,388,216 A * 2/1995 Oh .............................. 710/29
5,966,407 A * 10/1999 Hiraki et al. ................ 375/257
6,087,878 A * 7/2000 Suzuki et al. ............... 327/319
6,286,124 B1 * 9/2001 Hopper et al. .............. 714/799
6,384,930 B1 * 5/2002 Ando ......................... 358/1.17

* cited by examiner

*Primary Examiner*—Michael Tokar
*Assistant Examiner*—Vibol Tan
(74) *Attorney, Agent, or Firm*—William B. Kempler; W. James Brady, III; Frederick J. Telecky, Jr.

(57) ABSTRACT

An interface circuit for a printer to prevent transmission of an incorrect control signal when power is input into the printer. The interface circuit improves the stability of the printer at the initial state of the rise of power supply voltages, and prevents erroneous operation. After power is input, in a switching control part 110, a flip-flop X23 is reset, a level change of output signals s1–s5 of an input part 100 is detected by a NAND gate X21, and an output signal s9 of the flip-flop X23 is raised. In a switching part 120, when the signal s9 is at low level, output signals s10–s14 are held at high level, and when the signal s9 is at high level, the output signals s1–s5 of the input part 100 are output to an output part 130. Thus, the output signals are held after the power input, and after the input signal rises, the signal transfer function is started, so that the output of incorrect control signals can be prevented, and thereby erroneous operation of a printer can be prevented.

6 Claims, 4 Drawing Sheets

INTERFACE CIRCUIT

FIELD OF THE INVENTION

The present invention pertains to an interface circuit for a printer that transmits and receives signals between a printer and a host computer. In particular, it pertains to an interface circuit for a printer that can prevent erroneous operation when power is input.

BACKGROUND OF THE INVENTION

In a printer that prints a prescribed figure or character information on a printing paper in accordance with control signals and data from a computer, a control circuit for controlling each part of the printer and an interface circuit (input and output circuit) for inputting and outputting signals are installed. For example, the interface circuit has an input and output function that transmits a state signal showing a printer state to the computer, receives control signals and the data from the computer, and transfers them to the control circuit, etc.

Currently, as such an interface circuit, a system called an IBM-PC compatible parallel interface or centronics interface is generally adopted. In this system, asynchronous data transfer is carried out between a printer and a computer by so-called handshake control. In other words, the data transmission side first confirms whether not or the other party (reception side) is in a receivable state by checking the state of a specific signal line and transmits the data when it is confirmed that the reception side is in a receiving state. With such handshake control, a large amount of data can be transmitted and received without generating an overflow.

On the other hand, in the above-mentioned conventional interface circuit for a printer, due to scatter in the rise timing of power supply voltage when power for the printer is input, the computer side for transmitting data sometimes erroneously decides the printer state of the reception side. Thus, the data are transmitted in a state in which the printer side cannot be prepared for reception, so that an erroneous operation of the printer is caused or the printer cannot be controlled.

This will be explained by referring to the figures. FIG. 5 shows a constitutional example of an interface system including printer, printer cable, and computer. As shown in the figure, a printer 10 is connected to a computer 30 via a printer cable 20. In the printer 10, a control circuit 12 and an input and output circuit 14 are installed.

The control circuit 12 is a circuit for controlling the operation of each part of the printer 10. The input and output circuit 14 outputs control signals output from the control circuit 12 to the computer 30, receives control signal and data from the computer 30, and outputs them to the control circuit 12. For example, the control circuit 12 supplies a busy signal showing a printer state and/ack, which is a response signal to the computer, to the input and output circuit 14. On the other hand, the input and output circuit 14 transfers a strobe signal/STB transmitted from the printer cable to the control circuit 12 and further transfers data output from the computer to the control circuit 12. Also, as shown in the figure, the input and output circuit 14 supplies a power supply voltage $V_{CC2}$ to the computer 30 via the printer cable.

As shown in the figure, for example, two power supply voltages $V_{CC1}$ and $V_{CC2}$ are supplied to the inside of the printer 10. Power supply voltage $V_{CC1}$ is supplied to an IC circuit and is 3.3 V, for instance. Power supply voltage $V_{CC2}$ is supplied to an interface part of a data bus and is 5.0 V, for instance. Power supply voltage $V_{CC1}$ is supplied to both the control circuit 12 and the input and output circuit 14, the power supply voltage $V_{CC2}$ is supplied to the input and output circuit 14. Since power supply voltages $V_{CC1}$ and $V_{CC2}$ are respectively generated by separate power supplies, scatter exists in the rise timing of these power supply voltages when power is input. In other words, power supply voltages $V_{CC1}$ and $V_{CC2}$ do not simultaneously rise to prescribed reference values but reach the reference values with a time interval.

The transmission and reception of data between the printer and the computer cannot operate normally due to scatter in the rise of power supply voltages $V_{CC1}$ and $V_{CC2}$. This will now be explained referring to FIG. 6.

FIG. 6 is a waveform diagram showing operation timing if the power supply voltage $V_{CC2}$ rises first and the power supply voltage $V_{CC1}$ then rises when power is input.

FIG. 6(a) shows a waveform of the power supply voltage $V_{CC2}$ immediately after power input, and FIG. 6(b) shows a waveform of the power supply voltage $V_{CC1}$. As shown in the figure, after power input, first, the power supply voltage $V_{CC2}$ rises and is held at a prescribed reference value such as 5.0 V. The power supply voltage $V_{CC1}$ rises later than $V_{CC2}$ and is held at a prescribed reference value such as 3.3 V.

When the power supply voltage $V_{CC2}$ reaches the reference value, an output buffer part of the input and output circuit is operated, and signal lines 21, 22, and 23 of the printer cable 20 are pulled up to almost the same level as the power supply voltage $V_{CC2}$ by a pull-up resister of the input and output circuit 14. For this reason, a control signal for notifying the state of the printer 10 to the computer 30 (hereinafter, indicated as state signal) as BUSY and a response signal/ACK are held at the level of the power supply voltage $V_{CC2}$, that is, a high level.

As illustrated in FIG. 6(b), the power supply voltage $V_{CC1}$ rises at a time $t_1$ that is slightly later than the rise time of the power supply voltage $V_{CC2}$. Since the control circuit 12 is operated by the power supply voltage $V_{CC1}$, as shown in FIG. 6(c), after the power supply $V_{CC1}$ rises, the control signal busy and the response signal/ack are respectively pulled up to a high level (power supply voltage $V_{CC1}$.

For this reason, as shown in FIG. 6(d), after the state signal BUSY and the response signal/ACK are pulled up to a high level (power supply voltage $V_{CC2}$) by the input and output circuit 14, the control signal busy and the response signal/ack output from the control circuit 12 are still at low level for a prescribed period after the time $t_1$. For this reason, the input and output circuit 14 pulls down the state signal BUSY and the response signal/ACK in accordance with these input signals.

When data for printing are transmitted, the computer 30 monitors the signal lines 22 and 23 of the printer cable 20, that is, monitors the state signal BUSY and the response signal/ACK being transmitted from the printer 10. If these signals are at low level, the computer decides that the printer is in a printing standby state (READY), pulls down the strobe signal/STB to a low level, and starts to transmit the data.

However, at that time, the printer is not yet in a printing standby state and cannot receive the data being sent from the computer 30. For this reason, a so-called hangup state is formed in which data communication of the computer 30 and the printer 10 is impossible, or the printer sometimes prints incorrect characters and figures.

Usually, as a correct sequence, after the power of the printer 10 is input, a printing command is implemented from the computer 30, and printing data are transmitted. However, this sequence is sometimes not followed. For example, there are also users who sense that power has still not been input into the printer 10 after the transmission of printing data from the computer 30 and turn on the power switch. In such an operation, in the printer 10, for example, as mentioned above, due to scatter of the operation timing of the power voltage supply circuit for supplying the power supply voltages $V_{CC1}$ and $V_{CC2}$, the power supply voltage $V_{CC2}$ rises, and the power supply voltage $V_{CC1}$ then rises. For this reason, as shown in FIG. 6(d), the state signal BUSY and the response signal/ACK are held at low level in accordance with the output signal busy and/ack of the control circuit 12 by the input and output circuit 14 of the printer 10. The computer 30 detects that the state BUSY and the response signal/ACK are at low level, recognizes that the printer is in a printing standby state, and starts to transmit printing data. In actuality, at that time, there is a possibility that the printer 10 cannot receive the printing data from the computer 30 during initialization processing after the power input and will enter into a hangup state.

The present invention considers such a situation, and its objective is to provide an interface circuit for a printer that can prevent transmission of an incorrect control signal when power is input into the printer, stabilizes the operation state of the printer in the initial state of power supply voltage rise, and can prevent erroneous operation.

SUMMARY OF THE INVENTION

In accordance with one aspect of the interface circuit of the present invention consists of a switching circuit having several selective output circuits, which input several input signals and one control signal and output an output signal corresponding to a logic level of the above-mentioned input signal in accordance with the logic level of the above-mentioned control signal or an output signal of a prescribed logic level, and a first logic circuit which outputs the above-mentioned control signal at a prescribed logic level for a prescribed period from the input of power.

Also, in accordance with an aspect of the invention, the logic circuit is appropriately a flip-flop or latch that inputs a power ON reset signal to its reset terminal.

Also, in accordance with an aspect of the invention, the switching control circuit has a second logic circuit that outputs a signal corresponding to a logic arithmetic result of the above-mentioned several input signals, and the output signal of the above-mentioned second logic circuit is supplied to a clock input terminal of the above-mentioned flip-flop or latch.

Furthermore, in accordance with an aspect of the present invention, appropriately, the above-mentioned switching control circuit has a noise suppression circuit that is installed between the above-mentioned second logic circuit and the above-mentioned first logic circuit and integrates and outputs the output signal of the above-mentioned second logic circuit.

Furthermore, the above-mentioned selective output circuit and the above-mentioned second logic circuit can be appropriately constituted by a NAND element.

REFERENCE NUMERALS AND SYMBOLS AS SHOWN IN THE DRAWINGS

In the figures, 10 represents a printer, 12 represents a control circuit, 14 represents an input and output circuit, 20 represents a printer cable, 30 represents a computer, 100 represents an input part, 110 represents a switching control part, 120 represents a switching part, 130 represents an output part, $V_{CC1}$, $V_{CC2}$ represent power supply voltages, and GND represents ground potential.

DESCRIPTION OF THE EMBODIMENT

Figure 1:
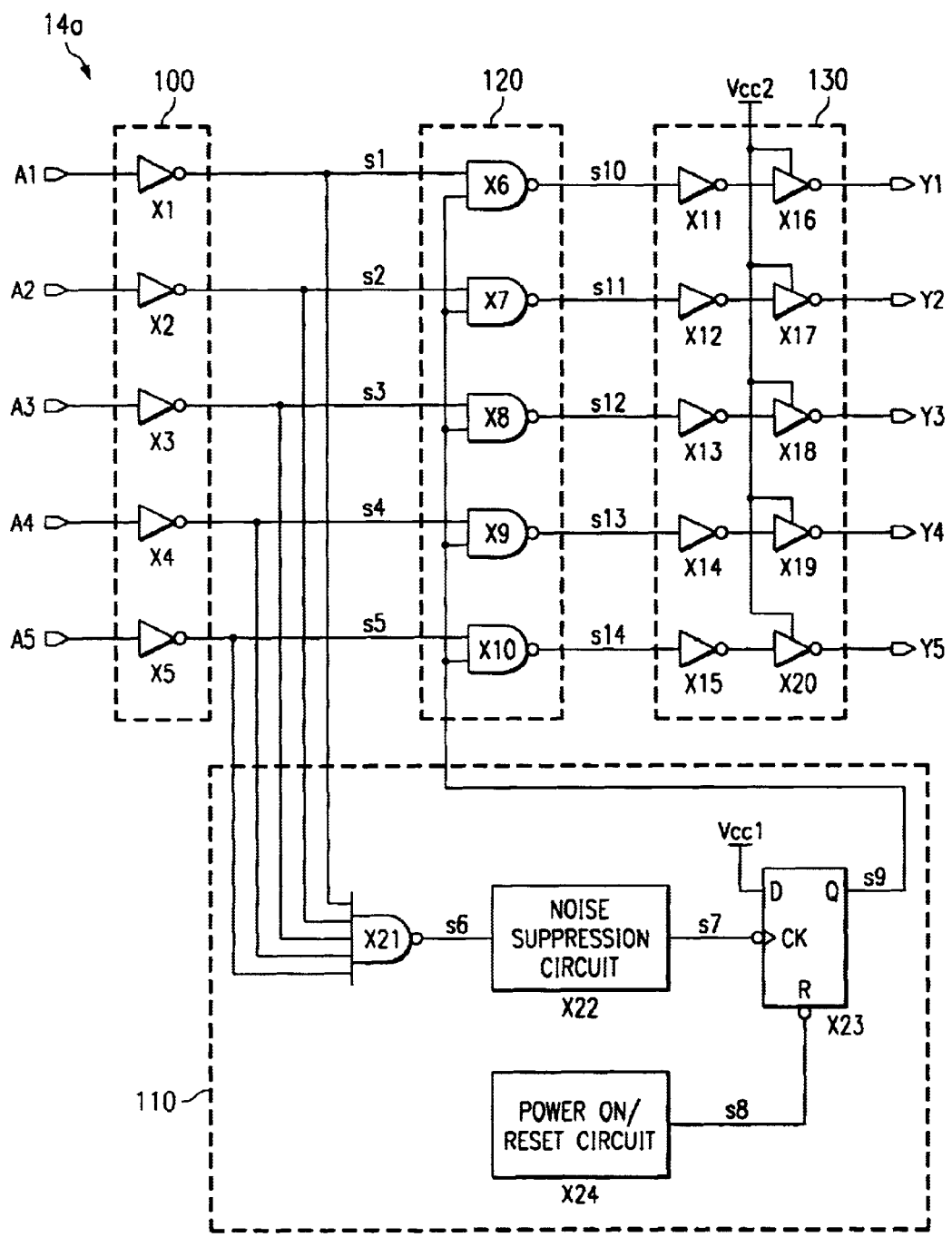
FIG. 1 is a circuit diagram showing an embodiment of the interface circuit of the present invention.
Figure 5:
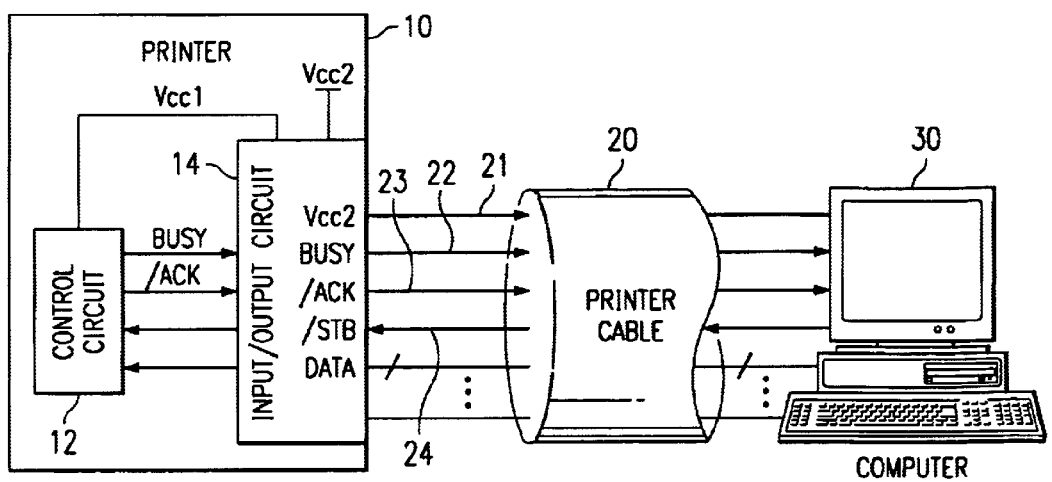
FIG. 5 shows the interface circuit for a printer and its connection.
Figure 6A:
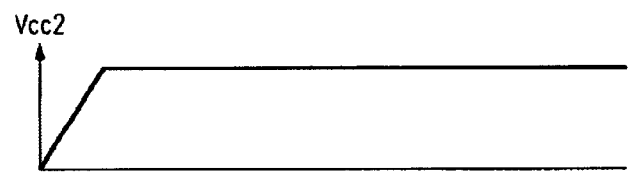
FIG. 6 is a waveform diagram showing a signal waveform when power is input.
Figure 6B:
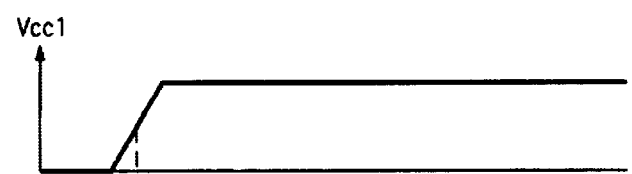
Figure 6C:
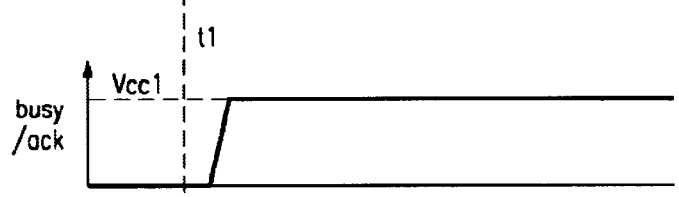
Figure 6D:
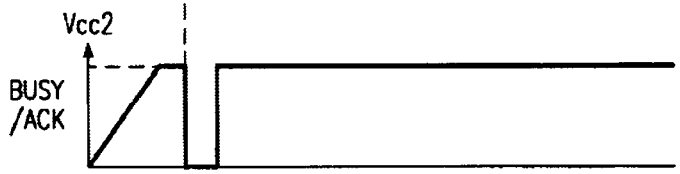
Figure 6E:

FIG. 1 is a circuit diagram showing an embodiment of the interface circuit of the present invention. As shown in the figure, the interface circuit of this embodiment consists of input part 100, switching control part 110, switching part 120, and output part 130. Also, as shown in the figure, the interface circuit of this embodiment outputs output signals Y1–Y5 in accordance with five input signals A1–A5. The interface circuit, for example, is an interface circuit 14a, which outputs control signals from the control circuit 12 to the printer cable 20, in the input and output circuit 14 of the printer 10 shown in FIG. 5.

In the interface circuit 14a, the input part 100 consists of inverters X1–X5. These inverters respectively output logic inverting signals s1–s5 of the input signals A1–A5.

The switching control part 110 consists of NAND gate X21, noise suppression circuit X22, flip-flop X23, and power ON reset circuit X24.

The NAND gate X21 attains an inverted AND (NAND) of the output signals s1–s5 of the input part 100 and outputs a signal s6 as the result.

The noise suppression circuit X22, for example, is constituted by an integrating circuit and suppresses noise for the output signal s6 of the NAND gate X21. In particular, when the rise of the power supply voltage and the level of the output signal s6 of the NAND gate X21 are changed, noise is suppressed, and a signal s7 is output. A constitutional example of the noise suppression circuit X22 will be explained in detail below.

The flip-flop X23 is constituted by a D flip-flop, and its data input terminal D is connected to the power supply voltage $V_{CC1}$. The output signal s7 of the noise suppression circuit X22 is input into a clock signal input terminal CK. Also, an output signal s8 of the power ON reset circuit X24 is input into a reset terminal R of the D flip-flop X23. A signal s9 is output from an output terminal Q of the D flip-flop X24, and the signal is supplied to the switching part 120.

In the power ON reset circuit X24, after the power supply voltage is input, the output signal s8 is held at low level for a prescribed time. For this reason, since the flip-flop X23 is held in a reset state for a prescribed time after the power supply input in accordance with the signal s8, the output signal s9 is held at low level.

The constitutional example of the power ON reset circuit will be explained in further detail below.

The switching part 120 is constituted by the NAND gates X6–X10. As shown in the figure, the output signals s1–s5 of the input part 100 are respectively input into one input terminal of these NAND gates, and the output signal s9 of the switching control part 110 is input into the other input terminal. For this reason, while the output signal s9 of the switching control part 110 is held at low level, the outputs of the NAND gates X6–X10 are held at high level, regardless of the logic level of the output signals s1–s5 of the input part 100. On the other hand, when the output signal s9 of the switching control part 110 is held at high level, the NAND gates X6–X10 output logic inverting signals s10–s14 of the output signals s1–s5 of the input part 100.

Thus, in accordance with the output signal s9 from the switching control part 110, the switching part 120 fixes the output signals to a high level or outputs the input signals A1–A5 to the output part 130. In other words, the output signal s9 of the switching control part 110 functions as a control signal for controlling the output state of the switching part 120.

The output part 130 converts the level of the output signals s10–s14 of the switching part 120 and outputs the output signals Y1–Y5.

Here, for simplicity, as shown in FIG. 1, the output part 130 is simply constituted by inverters X11–X15 and inverters X16–X20, however the actual output part 130 is a buffer circuit including a level conversion function that converts the signal of the power supply voltage $V_{CC1}$ level into the signal of the power supply voltage $V_{CC2}$. Also, the power supply voltage $V_{CC1}$ is 3.3 V, for instance, and the power supply voltage $V_{CC2}$ is 5.0 V, for instance. In other words, the power supply voltage $V_{CC2}$ is also supplied in addition to the power supply voltage $V_{CC1}$ to the output part 130.

Also, all the above-mentioned input part 100, switching control part 110, and switching part 120 are operated by the power supply voltage $V_{CC1}$.

In the output part 130, when the input signals s10–s14 are at high level, that is, when the signal level is held at the power supply voltage $V_{CC1}$, the output signals Y1–Y5 of the output part 130 are held at high level, that is, the signal level is held at the power supply voltage $V_{CC2}$. FIG. 1 omits the level shift circuit and shows an outlined circuit constitution with only the inverters.

Figure 2:
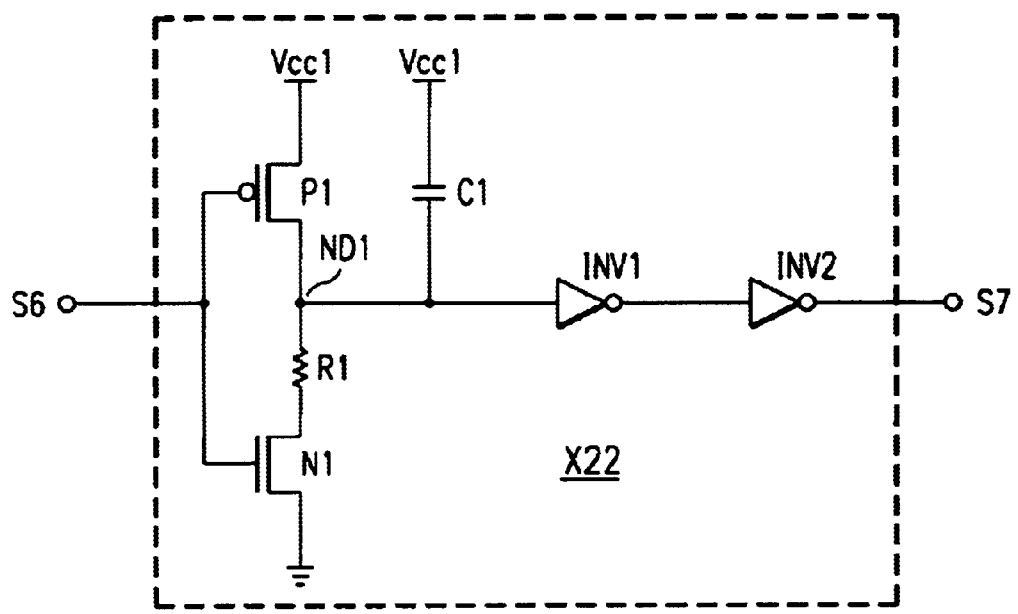
FIG. 2 is a circuit diagram showing a constitutional example of a noise suppression circuit within a switching control part of the interface circuit.

FIG. 2 is a circuit diagram showing a constitutional example of the noise suppression circuit X22. Referring to FIG. 2, the constitution and operation of the noise suppression circuit X22 will be explained.

As shown in the figure, the noise suppression circuit X22 consists of pMOS transistor P1, nMOS transistor N1, resistance element R1, capacitor C1, and inverters INV1 and INV2.

The source of the transistor P1 is connected to the power supply voltage $V_{CC1}$, and the drain is connected to a node ND1. The source of the transistor N1 is grounded, and the drain is connected to node ND1 through the resistance element R1. The gates of the transistors P1 and N1 are commonly connected, and the output signal s6 of the NAND gate X21 is applied to the connecting point.

The capacitor C1 is connected between the power supply voltage $V_{CC1}$ and the node ND1. Also, the inverters INV1 and INV2 are connected in series, and the input terminal of the inverter INV1 is connected to the node ND1. The signal s7 is output from the output terminal of the inverter INV2.

In the noise suppression circuit with such constitution, when the supply of the power supply voltage $V_{CC1}$ starts, the node ND1 is pulled up to almost the power supply voltage $V_{CC1}$ by the capacitor C1. Also, after the power supply voltage $V_{CC1}$ rises, the output signal s6 of the NAND gate X21 is held at low level. In response to it, the transistor P1 is turned on, and the transistor N1 is turned off. Thus, the node ND1 is held at the power supply voltage $V_{CC1}$. In other words, if the power supply voltage $V_{CC1}$ is supplied, the node ND1 is held at high level, and the output signal s7 of the noise suppression circuit X22 is held at high level.

When the output signal s6 of the NAND gate X21 is switched from low level to high level, the transistor N1 is turned on, and the transistor P1 is turned off. Since electric charge accumulates via the resistance element R1 and the transistor N1 in response to this, the node ND1 drops with a time constant determined by the resistance value of the resistance element R1 and the capacity value of the capacitor C1. Then, if the level of the node ND1 is lower than a threshold voltage of the inverter INV1, the logic level of the inverter INV1 and the inverter INV2 is changed, and the output signal s7 is switched from high level to low level.

As shown in FIG. 1, the switching control part 110 receives the level change of the signal s7, and the output of the flip-flop X23 is switched.

Figure 3:
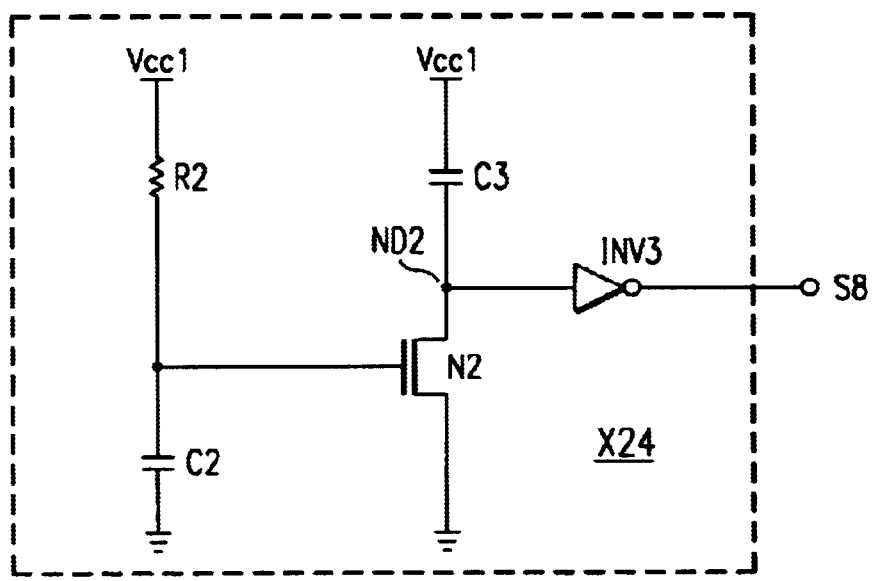
FIG. 3 is a circuit diagram showing a constitutional example of a power ON reset circuit within the switching control part of the interface circuit.

FIG. 3 is a circuit diagram showing a constitutional example of the power ON reset circuit X24. Referring to FIG. 3, the constitution and operation of the power ON reset circuit X24 will be explained.

As shown in the figure, the power ON reset circuit X24 consists of resistance element R2, capacitors C2 and C3, nMOS transistor N2, and inverter INV3.

As shown in the figure, the resistance element R2 and the capacitor C2 are connected in series between the power supply voltage $V_{CC1}$ and the ground potential GND. Also, the capacitor C3 and the transistor N2 are connected in series between the power supply voltage $V_{CC1}$ and the ground potential GND, and the gate of the transistor N2 is connected to the connecting point of the resistance element R2 and the capacitor C2.

The input terminal of the inverter INV3 is connected to the connecting point of the capacitor C3 and the drain of the transistor N2, that is, the node ND2. The output signal s8 of the inverter INV3 is supplied as a reset signal to the reset terminal R of the flip-flop X23.

In the power ON reset circuit X24 with such a constitution, if the supply of the power supply voltage $V_{CC1}$ starts, first, the node ND2 is pulled up by the capacitor C3 and held almost at the power supply voltage $V_{CC1}$. At that time, the output signal s8 of the inverter INV3 is held at low level.

Since the capacitor C2 is charged via the resistance element R2, the gate voltage of the transistor N2 is slowly raised, and if it reaches the threshold voltage of the transistor N2, the transistor N2 is switched to a conductive state. In response to it, the node ND2 is switched from high level to low level. Then, the output signal s8 of the inverter INV3 is switched from low level to high level.

When the signal s8 is at low level, the flip-flop X23 is reset, and if the signal s8 is at high level, the reset state is released. At that time, the output state of the flip-flop X23 is switched in accordance with the input signal of the clock terminal CK, and the output terminal Q is changed from low level to high level in a reset state.

Next, referring to FIG. 4, the constitution and operation of the switching control part 110 of the interface circuit of this embodiment will be explained in further detail.

Figure 4:
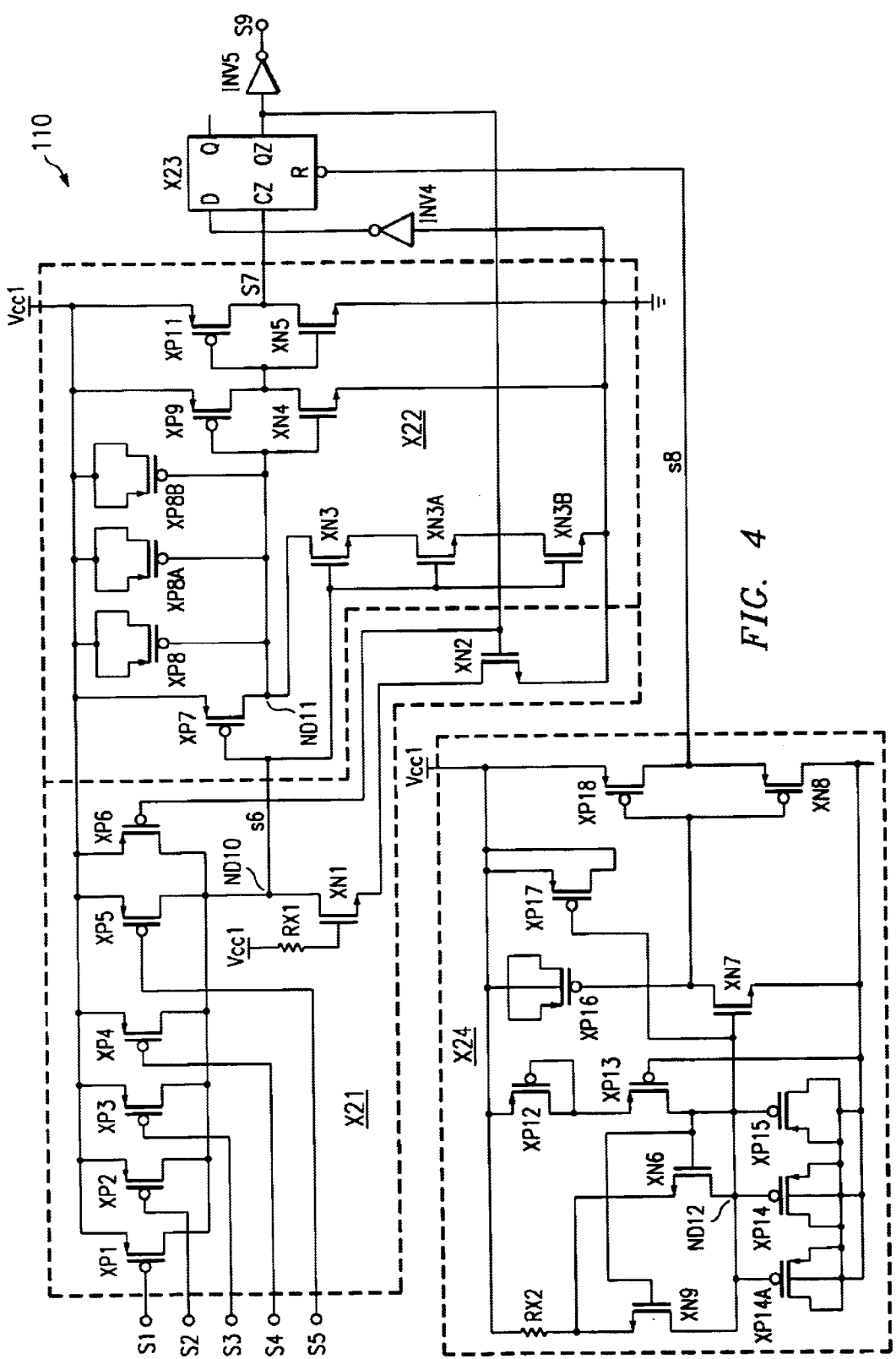
FIG. 4 is a circuit diagram showing a constitutional example of the switching control part of the interface circuit.

FIG. 4 is a circuit diagram showing each constitutional part of the switching control part 110. As shown in the figure, the switching control part 110 consists of NAND gate X21, noise suppression circuit X22, flip-flop X23, and power ON reset circuit X24. Next, each constitutional part will be explained.

The NAND gate X21 consists of pMOS transistors XP1, XP2, . . . , XP6, nMOS transistors XN1 and XN2, and resistance element RX1.

As shown in the figure, the transistors XP1–XP6 are connected in parallel between the power supply voltage $V_{CC1}$ and the node ND10. The output signals s1, s2, . . . , s5 of the input part 100 are respectively applied to the gates of the transistors XP1, XP2, . . . , and XP5. An output signal of an inverting output terminal QZ of the flip-flop X23 is applied to the gate of the transistor XP6.

The transistors XN1 and XN2 are connected in series between the node ND10 and the ground potential GND. The gate of the transistor XN1 is connected to the power supply voltage $V_{CC1}$ via the resistance element RX1, and the output signal of the inverting output terminal QZ of the flip-flop X23 is applied to the gate of the transistor XN2.

In the NAND gate X21 with such a constitution, when the supply of the power supply voltage $V_{CC1}$ starts, first, all the output signals s1–s5 of the input part 100 are held at high level. Also, since the flip-flop X23 is held in a reset state, the output signal of the inverting output terminal QZ is also held at high level. For this reason, since the transistors XP1–XP6 are in a cut-off state and the transistors XN1 and XN2 are in a conductive state, the node ND10 is held at low level, that is, the ground potential GND. Thus, after the power is input, the output signal s6 of the NAND gate is held at low level.

Next, as shown in FIG. 4, the noise suppression circuit X22 consists of pMOS transistors XP7, XP8, XP8A, XP8B, XP9, and XP11 and nMOS transistors XN3, XN3A, XN3B, XN4, and XN5.

The transistors XP7 and XN3, XN3A, and XN3B are connected in series between the power supply voltage $V_{CC1}$ and the ground potential GND. The gates of these transistors are commonly connected to the node ND10. A node ND11 is formed by the connecting point of the drains of the transistors XP7 and XN3.

The sources and the drains of the transistors XP8, XP8A, and XP8B are connected to the power supply voltage $V_{CC1}$, and the gates are connected to the node ND11. That is, a capacitor is formed by those transistors. This capacitor corresponds to the capacitor C1 shown in FIG. 2.

The transistors XP9 and XN4 and the transistors XP11 and XN5 respectively constitute inverters. These inverters correspond to the inverters INV1 and INV2 shown in FIG. 2.

In the noise suppression circuit X22 with the above-mentioned constitution, since the output signal s6 of the NAND gate X21 immediately after power input is held at low level, the transistor XP7 conducts, and the transistors XN3, XN3A, and XN3B are in a cut-off state, so that the node ND11 is held at high level. For this reason, at that time, the output signal s7 is held at high level.

After the printer power is input, control signals output from the control circuit 12, for example, a control signal busy showing a state or a response signal/ack, rise to a high level. In response to this, any of the output signals s1–s5 of the input part 100 of the interface circuit is switched from high level to low level. In response to this, the output signal s6 of the NAND gate X21 is switched to high level. In the noise suppression circuit X22, the transistor XP7 is in a cut-off state, and the transistors XN3, XN3A, and XN3B are in a conductive state. For this reason, since the potential of the node ND11 drops with a time constant determined by the serial ON resistance of the transistors XN3, XN3A, and XN3B and the capacity value of the capacitor consisting of the transistors XP8, XP8A, and XP8B, if the potential is at a threshold voltage or less of the inverter constituted by the transistors XP9 and XN4, the output of the inverter is switched. Thus, the output of the inverter constituted by the transistors XP11 and XN5 is switched from high level to low level.

Since the output signal s7 of the noise suppression circuit X22 is input into an inverting clock terminal CZ of the flip-flop X23, if the signal s7 is at low level, the input signal of the data input terminal D is transferred to the output terminal Q in the flip-flop X23. When the flip-flop X23 is in a reset state, the output terminal Q is held at low level, and the inverting output terminal QZ is held at high level. For this reason, since the signal s7 is at low level, the output terminal Q is at high level, and the inverting output terminal QZ is at low level. In response to this, the output signal s9 of the inverter INV5 is at high level. For this reason, in the switching part 120, the output signals s1–s5 of the input part 100 are output to the output part 130.

The power ON reset circuit X24 has almost the same constitution as that of the above-mentioned circuit shown in FIG. 3. In other words, a capacitor is constituted by the pMOS transistors XP14, XP14A, and XP15 connected in parallel between the node ND12 and the ground potential GND. This capacitor corresponds to the capacitor C2 shown in FIG. 3. Also, the pMOS transistors XP12 and XP13 connected in series between the power supply voltage $V_{CC1}$ and the node ND12 correspond to the resistance element R2 shown in FIG. 3. The pMOS transistor XP16 corresponds to the capacitor C3 shown in FIG. 3.

After the power supply voltage $V_{CC1}$ rises, the capacitor consisting of the transistors XP14, XP14A, and XP15 is charged through the transistors XP12 and XP13, and the voltage of the node ND12 is raised. If the voltage of the node ND12 reaches the threshold voltage of the transistor XN7, the transistor XN7 is in a conductive state. In response to this, the output of the node ND13 is changed from high level to low level, and the output signal s8 of the inverter consisting of the transistors XP18 and XN8 is changed from low level to high level.

As mentioned above, immediately after the power supply voltage $V_{CC1}$ rises, the output of the power ON reset circuit X24 is held at low level for a prescribed time. In response to this, the flip-flop X23 is held in a reset state. Then, when a fixed time has lapsed, since the output signal s8 of the power ON reset circuit X24 is switched from low level to high level, the reset state of the flip-flop X24 is released.

Next, referring to FIG. 4, the entire operation of the switching control circuit 110 after the start of the supply of the power supply voltage is explained.

When the supply of the power supply voltage starts, the operation of the printer starts, and initialization, etc., are carried out. Also, control signals output by the control circuit 12 with a slight delay from the rise of the power supply voltage $V_{CC1}$, for example, a control signal busy showing a standby state or a response signal/ack, are held at high level.

If the output signal of the control circuit 12 is at high level, in the interface circuit 14a shown in FIG. 1, any of the output signals s1–s5 of the input part 100 is held at low level. In response to this, the output signal s6 of the NAND gate X21 is at high level in the switching control part 110. Then, after lapse of a prescribed time, the output signal s7 is switched from high level to low level by the noise suppression circuit X22. In other words, the input of the inverting clock terminal CZ of the flip-flop X23 is held at high level. At that time, if the reset state of the flip-flop X23 is released, the state is switched, so that the output terminal Q is changed to high level and the inverting output terminal QZ is changed to low level. In response to this, since the output signal s9 of the inverter INV5 is at high level, the output signals s1–s5 of the input part 100 are sent to the output part 130 via the switching part 120 in the interface circuit 14a.

If the state of the flip-flop X23 is changed, that is, the inverting output terminal QZ is at low level, the transistor XP6 is in a conductive state in the NAND gate X21 in response to this. For this reason, since the output signal s6 of the NAND gate X2 is held at high level, the state of the flip-flop X23 is maintained.

As mentioned above, in the interface circuit of this embodiment, immediately after the printer power is input, all the output signals of the switching part 120 in the interface circuit are held at high level by the switching part 120 being controlled in accordance with the switching control part 110 and the output signal s9 from said switching control part. Then, if the power supply voltage $V_{CC1}$ is normally supplied and any of the control signals being output from the control circuit 12 of the printer is at high level, the output signal s9 is switched from low level to high level after lapse of a prescribed time in the switching control part 110 in response to this, and the output signals s1–s5 of the input part 100 in the switching part 120 are respectively output to the output part 130 in response to this. In other words, the output signal from the control circuit 12 of the printer rises normally, and the interface circuit starts to transmit the signals.

Then, if the interface circuit starts an ordinary signal transmission, the states of the NAND gate X21, noise suppression circuit X22, and flip-flop X23 are respectively held in the switching control part 110, and the operation state of the interface circuit is also held.

As mentioned above, in the interface circuit of this embodiment, with the operation of installation of the switching part 120 in accordance with the switching control part 110 and the output signals of said switching control part, the signal transfer function is started in accordance with the state of the output signals s1–s5 of the input part 100. Thus, as shown in FIG. 6, even if the power supply voltage $V_{CC1}$ rises after the power supply voltage $V_{CC2}$, either a control signal busy or response signal/ack being output from the control circuit 12 of the printer is switched to high level, and the interface circuit starts the signal transmission, so transmission of incorrect control signals to the computer 30 can be prevented. On the other hand, if the power supply voltage $V_{CC1}$ rises before the power supply voltage $V_{CC2}$, the reset state of the flip-flop X23 is released by the power reset circuit X24, and the state of each part circuit of the switching control part 110 is switched in accordance with the output signals s1–s5 of the input part 100, so that the switching part 120 starts the signal transfer function. At that time, for example, if the power supply voltage $V_{CC2}$ rises, the output part 130 of the interface circuit is normally operated, the output signal of the switching part 120 is level-converted, and the output signals Y1–Y5 are output in accordance with the input signals A1–A5.

In other words, according to the interface circuit of this embodiment, since erroneous operation due to scatter in the rise of the power supply voltages can be avoided after the power input to a printer, even if the printer power is input after implementing a printing command from the computer, printing can be normally carried out without an erroneous operation. Also, the above-mentioned flip-flop X23 can be replaced with a latch circuit.

As explained above, according to the interface circuit of the present invention, erroneous operation due to scatter in the rise timing of the power supply voltages of a printer can be prevented, so that operation stability of the printer can be improved, thereby improving the usage of the printer.

Also, according to the interface circuit of this embodiment, since the interface circuit of the printer is assembled into an integrated circuit (IC), the circuit constitution other than the IC circuit is not changed, the number of parts is not changed, and the layout of a substrate on which the IC and other circuit parts are mounted can be used without change. Thus, the increase in cost due to the change of the circuit constitution can be suppressed to a minimum.

Furthermore, since the IC of the interface circuit can be realized by the slight addition of switching control part, switching part, etc., to a conventional circuit, the design change is little, and the cost increase can be suppressed.

What is claimed is:

1. An interface circuit comprising a switching circuit having a plurality of selective output circuits, receiving a plurality of input signals and one control signal and generating an output signal corresponding to a logic level of the input signals in accordance with the logic level of a control signal or an output signal of a prescribed logic level, and a first logic circuit which generates the control signal at a prescribed logic level for a prescribed period from input of power.

2. The interface circuit of claim 1, wherein the first logic circuit is a flip-flop or latch receiving a power ON reset signal at a reset terminal.

3. The interface circuit of claim 2, wherein the switching control circuit has a second logic circuit that generates a signal corresponding to a logic arithmetic result of the plurality of input signals; and the output signal of the second logic circuit is supplied to a clock input terminal of the flip-flop or latch.

4. The interface circuit of claim 3, wherein the switching control circuit has a noise suppression circuit coupled between the second logic circuit and the first logic circuit and integrates the output signal of the second logic circuit.

5. The interface circuit of claim 3, wherein the selective output circuit and the above-mentioned second logic circuit are constituted by a NAND gate.

6. The interface circuit of claim 4, wherein the selective output circuit and the above-mentioned second logic circuit are constituted by a NAND gate.

* * * * *